United States Patent
Sasaki et al.

(10) Patent No.: US 8,485,771 B2
(45) Date of Patent: Jul. 16, 2013

(54) LOAD PORT APPARATUS AND DUST EXHAUST METHOD FOR LOAD PORT APPARATUS

(75) Inventors: Mutsuo Sasaki, Tokyo (JP); Hitoshi Suzuki, Tokyo (JP); Koichiro Oikawa, Tokyo (JP)

(73) Assignee: TDK Corporation, Tokyo (JP)

( * ) Notice: Subject to any disclaimer, the term of this patent is extended or adjusted under 35 U.S.C. 154(b) by 414 days.

(21) Appl. No.: 12/880,861

(22) Filed: Sep. 13, 2010

(65) Prior Publication Data

US 2011/0070055 A1  Mar. 24, 2011

(30) Foreign Application Priority Data

Sep. 18, 2009 (JP) .................................. 2009-216436

(51) Int. Cl.
*B65G 49/07* (2006.01)
(52) U.S. Cl.
USPC ........ 414/411; 414/217.1; 414/805; 414/939; 141/51; 141/63
(58) Field of Classification Search
USPC ................. 414/217.1, 411, 805, 939; 141/51, 141/63
See application file for complete search history.

(56) References Cited

U.S. PATENT DOCUMENTS

| | | | | |
|---|---|---|---|---|
| 5,586,585 A | * | 12/1996 | Bonora et al. | 141/93 |
| 6,984,839 B2 | * | 1/2006 | Igarashi et al. | 250/559.33 |
| 7,568,875 B2 | * | 8/2009 | Le Guet et al. | 414/411 |
| 7,789,609 B2 | * | 9/2010 | Okabe et al. | 414/217 |
| 8,082,955 B2 | * | 12/2011 | Okabe | 141/51 |
| 8,251,636 B2 | * | 8/2012 | Sasaki et al. | 414/810 |
| 8,302,637 B2 | * | 11/2012 | Okabe et al. | 141/98 |
| 2005/0265812 A1 | * | 12/2005 | Suzuki et al. | 414/411 |
| 2006/0088406 A1 | * | 4/2006 | Miyajima et al. | 414/805 |

FOREIGN PATENT DOCUMENTS

| | | |
|---|---|---|
| JP | 2004-153281 | 5/2004 |
| JP | 2005-167284 | 6/2005 |
| JP | 3983219 | 9/2007 |

* cited by examiner

*Primary Examiner* — James Keenan
(74) *Attorney, Agent, or Firm* — Oblon, Spivak, McClelland, Maier & Neustadt, L.L.P.

(57) ABSTRACT

In a load port apparatus, a door driving mechanism that supports a door through a communication opening portion leading to a mini-environment is housed in a housing chamber that is in communication with the mini-environment through the communication opening portion. Exhaust opening portions are provided in the upper portion of a wall of the housing chamber that is opposed to the communication opening portion and a bottom wall of the housing chamber. Thus, gas passages from the mini-environment to the housing chamber and then to the external space are formed. Thus, dust in the load port apparatus is removed.

7 Claims, 15 Drawing Sheets

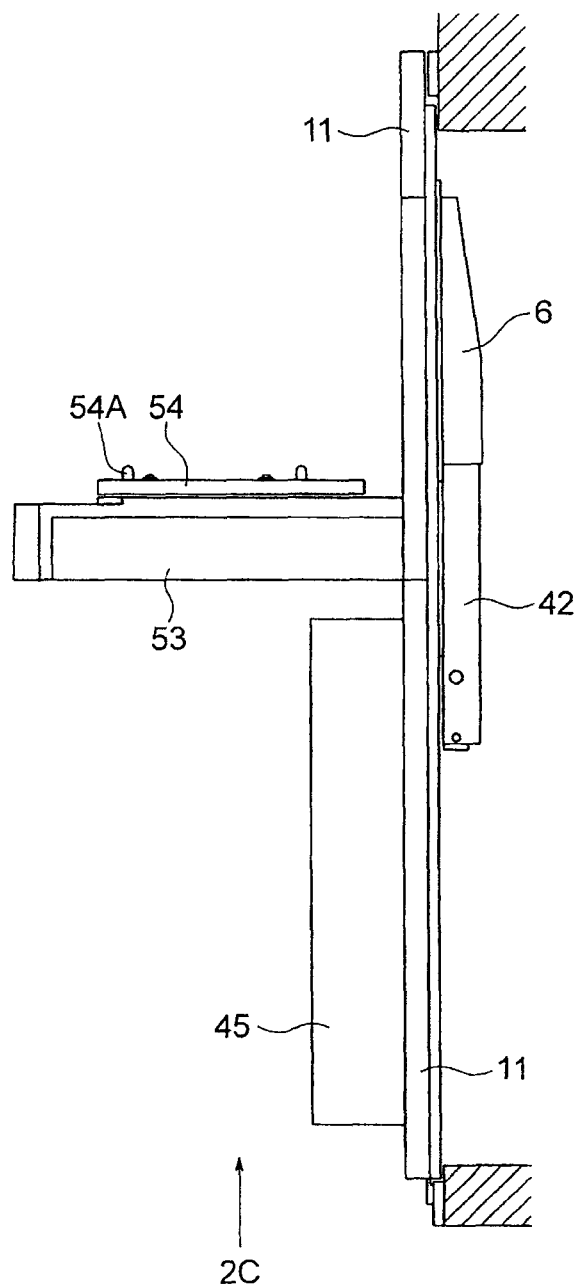

PRIOR ART

LOAD PORT APPARATUS AND DUST EXHAUST METHOD FOR LOAD PORT APPARATUS

BACKGROUND OF THE INVENTION

1. Field of the Invention

The present invention relates to what is called a FIMS (Front-Opening Interface Mechanical Standard) system or load port apparatus that is used when wafers stored in the interior of a transfer container called a pod are transported between semiconductor processing apparatuses in a semiconductor manufacturing process etc. More specifically, the present invention relates to a load port apparatus in which the degree of cleanliness in what is called a mini-environment provided in the interior of the load port apparatus is improved as compared to conventional apparatuses, or a high degree of cleanliness can be maintained reliably, and to a dust exhaust method for removing dust from the interior of the load port apparatus.

2. Description of the Related Art

Previously, the semiconductor manufacturing process had been performed in what is called a clean room that is constructed by establishing a high degree of cleanliness in a room in which semiconductor wafers are handled. In recent years, however, to cope with an increase in the wafer size and with a view to reduce cost incurred in maintenance of the clean room, such systems have been reconsidered. In consequence, in recent years, use has been generally made of a method of keeping clean only the interior of each processing apparatus, a pod and a mini-environment through which substrates or wafers are transferred between the pod and each processing apparatus, thereby controlling the cleanliness throughout the process.

The pod is composed of a body in which wafers are stored and that has an opening provided on one side thereof through which wafers can be brought into/out of it, and a lid for closing the opening to seal the interior space of the pod. The mini environment has a first opening portion that can be opposed to the opening of the pod, and a second opening portion provided on the processing apparatus side opposite to the first opening portion. The load port apparatus includes a member or wall that constitutes a partition on which the first opening portion is provided, a door that closes the first opening portion, a door driving mechanism that control the motion of the door, and a support table on which the pod is to be placed.

The support table can support the pod in such a way that the opening of the pod and the first opening portion are opposed to each other. The support table is adapted to move the lid toward and away from the door together with the pod. The door can be caused by the door driving mechanism to hold the lid of the pod. The door is retracted downwardly away from the space between the first opening portion and the second opening portion while holding the lid. A robot is provided in the mini-environment. The robot has a part that can move into and away from the interior of the pod through the first opening portion and the opening of the pod and transfer wafers between the interior of the pod and the semiconductor processing apparatus through the pod opening, the first and second opening portions.

Normally, when the interior space of the pod in which wafers are stored is filled with a gas such as dry nitrogen having a controlled high degree of cleanliness to prevent contaminant and oxidizing gases etc. from entering the interior of the pod. However, when the lid of the pod is removed to allow the wafers in the pod to be taken out, the interior space of the pod and the aforementioned mini-environment is brought into communication with each other. To prevent the interior space of the pod from being contaminated through the mini-environment, a fan and filter are provided in the upper portion of the mini-environment. With the fan and filter, clean air controlled with respect to dust and particles is introduced into the mini-environment, thereby controlling contamination of the interior of the pod with dust etc. as much as possible.

The introduction of the external air into the mini-environment through the fan provided in the upper portion of the mini-environment creates down flow directed from the upper portion to the lower portion thereof in the mini environment. The down flow is intended to prevent dust, particles and the like generated by various driving mechanisms disposed in the lower portion of the mini-environment from adhering to wafers transported in the upper portion of the mini-environment and from entering the interior of the pod.

In the load port apparatus, when driving the door, various parts of the door driving mechanism that drives the door perform sliding operations. It is desired that dust generated by such operations be kept out of the mini-environment as much as possible. For this reason, the main drive system is disposed in a housing space for the drive system provided outside the mini-environment as described in Japanese Patent No. 3983219. The housing space and the mini-environment are in communication with each other through an elongated hole or the like having a minimum size. The driving mechanism supports the door through the elongated hole and operates the door in the mini-environment. In some cases, as disclosed in Japanese Patent Application Laid-Open No. 2005-167284, a forced exhaust apparatus such as a fan is provided in the lower portion of the housing space to forcibly discharge dust generated in the housing space to the exterior, thereby preventing dust from entering the mini-environment.

With increases in the packing density and improvements in the performance of semiconductor devices in recent years, the wiring width and the inter-wire gap have been made smaller. In consequence, it has become necessary to take care of smaller size dust particles that did not matter before. Dust can cause a problem in the semiconductor manufacturing process. The behavior of such very small dust particles is greatly different from that of the particles that have been conventionally taken care of. For example, very small dust particles are little affected by the gravity. For this reason, even if forced discharge is performed for the housing space using a fan as described in Japanese Patent No. 3983219, what is expelled effectively may be only the gas in the region near the fan and small particles floating therein.

In addition, the range over which the gas suction force of the fan acts is not so large. Therefore, it is considered difficult for the fan to exercise a significant influence on the direction of floating of minute dust particles at positions distant from the fan. Furthermore, in order to maintain the cleanliness in the mini-environment and to stabilize the motion of the gas in the mini-environment during opening/closing of the door, it is necessary that the pressure in the mini-environment be kept to be a little higher than the pressure in the external space. Therefore, it is practically not allowed to increase the efficiency of discharging minute dust particles by enhancing the performance of the fan, because the enhancement of the performance of the fan makes it difficult to maintain the pressure. In view of the above, there is a demand for a structure or method that can effectively remove minute dust particles or the like that are generated by the door driving mechanism and tend to stay in the space for a very long time.

SUMMARY OF THE INVENTION

The present invention has been made in view of the above-described situations. An object of the present invention is to provide a load port apparatus in which minute dust particles that might be generated by the door driving mechanism or other components can be removed effectively to the exterior of the mini-environment and the housing space. Another object of the present invention is to provide a dust exhaust method for load port apparatus by which dust particles or the like staying in the interior of the load port apparatus or in the mini-environment can be removed effectively.

To achieve the above object, according to the present invention, there is provided a load port apparatus that attaches/detaches a lid of a pod composed of the lid and a body portion that has an opening to be closed by the lid on one side and stores a content object in the interior, thereby opening/closing the opening to allow transfer of the content object into and out of the body portion, comprising: a wall that defines a mini-environment on a first side thereof and an external space on a second side thereof and has an opening portion that allows communication between the mini-environment and the external space; a door that is disposed on the first side of the wall, closes the opening portion, and can hold the lid; a support table that supports the pod at such a position that allows the opening to be opposed to the opening portion on the second side of the wall; a door driving mechanism that supports the door on the first side by a door supporting portion that operates on the second side to support the door and moves the door between a closing position at which the door closes the opening portion and an opening position at which the door leaves the opening portion open; a housing chamber disposed on the second side and houses the door driving mechanism, and defined as a chamber by plate members including a front wall and a bottom wall; and a communication opening portion provided in the wall through which the door supporting portion can pass and that allows communication between the housing chamber and the mini-environment, wherein the housing chamber has a first exhaust opening portion and a second exhaust opening portion, the first exhaust opening portion being provided in the front wall of the plate members of the housing chamber, opposed to the communication opening portion, so as to allow communication between the housing chamber and the external space, the second exhaust opening portion being provided in the bottom wall of the plate members of the housing chamber, and located at a position to which the door driving mechanism comes closest in the state in which the door leaves the opening portion open, so as to allow communication between the housing chamber and the external space, and pressure differences are established in such a way that the pressure in the mini-environment, the housing chamber, and the external space decreases in order of the mini-environment that contains the door on the first side, the housing chamber, and the external space, and streams of gas from the housing chamber to the external space through the first exhaust opening portion and the second exhaust opening portion are created by the pressure differences.

In the above-described load port apparatus, it is preferred that at least a portion of the first exhaust opening portion face the communication opening portion. Furthermore, it is more preferred that the load port apparatus further comprise a third opening portion that is provided at such a position in the front wall that allows gas existing in a gas stagnation region in an upper portion in the housing chamber to flow out. It is also preferred that the door driving mechanism further comprise a swing mechanism that swings the door in a predetermined angle range, and when the door is in a swung state at the opening position, the door faces the first exhaust opening portion through the communication opening portion. It is also preferred that the second exhaust opening portion be provided in the entire area so that a gas stagnation region is not formed in a lower portion of the housing chamber.

According to another aspect of the present invention, there is provided a dust exhaust method for load port apparatus for discharging dust generated in a load port apparatus, which attaches/detaches a lid of a pod composed of the lid and a body portion that has an opening to be closed by the lid on one side and stores a content object in the interior, thereby opening/closing the opening to allow transfer of the content object into and out of the body portion, to an external space, wherein the load port apparatus comprises: a wall that defines a mini-environment on a first side thereof and an external space on a second side thereof and has an opening portion that allows communication between the mini-environment and the external space; a door that is disposed on the first side of the wall, closes the opening portion, and can hold the lid; a support table that supports the pod at such a position that allows the opening to be opposed to the opening portion on the second side of the wall; a door driving mechanism that supports the door on the first side by a door supporting portion that operates on the second side to support the door and moves the door between a closing position at which the door closes the opening portion and an opening position at which the door leaves the opening portion open; a housing chamber disposed on the second side and houses the door driving mechanism, and defined as a chamber by plate members including a front wall and the bottom wall; and a communication opening portion provided in the wall through which the door supporting portion can pass and that allows communication between the housing chamber and the mini-environment, the housing chamber having a first exhaust opening portion and a second exhaust opening portion, the first exhaust opening portion being provided in the front wall of the plate members of the housing chamber, opposed to the communication opening portion, so as to allow communication between the housing chamber and the external space, the second exhaust opening portion being provided in the bottom wall of the plate members of the housing chamber, and located at a position to which the door driving mechanism comes closest in the state in which the door leaves the opening portion open, so as to allow communication between the housing chamber and the external space, the method comprising: forming down flow directed from an upper portion downwardly in the upper portion by introducing gas into the mini-environment that contains the door on the first side; introducing gas into the housing chamber from the mini-environment, the pressure in the mini-environment, which is higher than the pressure in the housing chamber by a first pressure difference due to the down flow, utilizing the first pressure difference; and creating streams of gas from the housing chamber, the pressure in the housing chamber, which is higher than the pressure in the external space by a second pressure difference due to the introduction of gas, to the external space through the first exhaust opening portion and the second exhaust opening portion utilizing the second pressure difference, thereby discharging dust generated in the housing chamber to the external space by the streams of gas.

In the above-described dust exhaust method for load port apparatus, it is preferred that the door driving mechanism further comprise a swing mechanism that swings the door in a predetermined angle range, and when the door is in a swung state at the opening position, the door divert the direction of the down flow toward the communication opening portion to assist the introduction of gas into the housing chamber.

According to the present invention, it is possible to discharge dust or the like generated in the housing chamber that defines a housing space to the external space quickly and effectively. Therefore, it is possible to prevent dust or the like to enter from the housing chamber into the mini-environment to maintain a high degree of cleanliness in the interior of the mini-environment. Furthermore, according to the present invention, the exhaust system such as, for example, a fan disclosed in Japanese Patent Application Laid-Open No. 2005-167284 can be eliminated. Therefore, there is not need for monitoring of the operation of the fan to find malfunction and maintenance of the fan. Consequently, a reduction in the cost of maintenance of the load port apparatus can be achieved.

Further features of the present invention will become apparent from the following description of exemplary embodiments with reference to the attached drawings.

BRIEF DESCRIPTION OF THE DRAWINGS

FIG. 2B shows the load port apparatus in the state shown in FIG. 2A as seen from the side.

DESCRIPTION OF THE EMBODIMENTS

Figure 1:
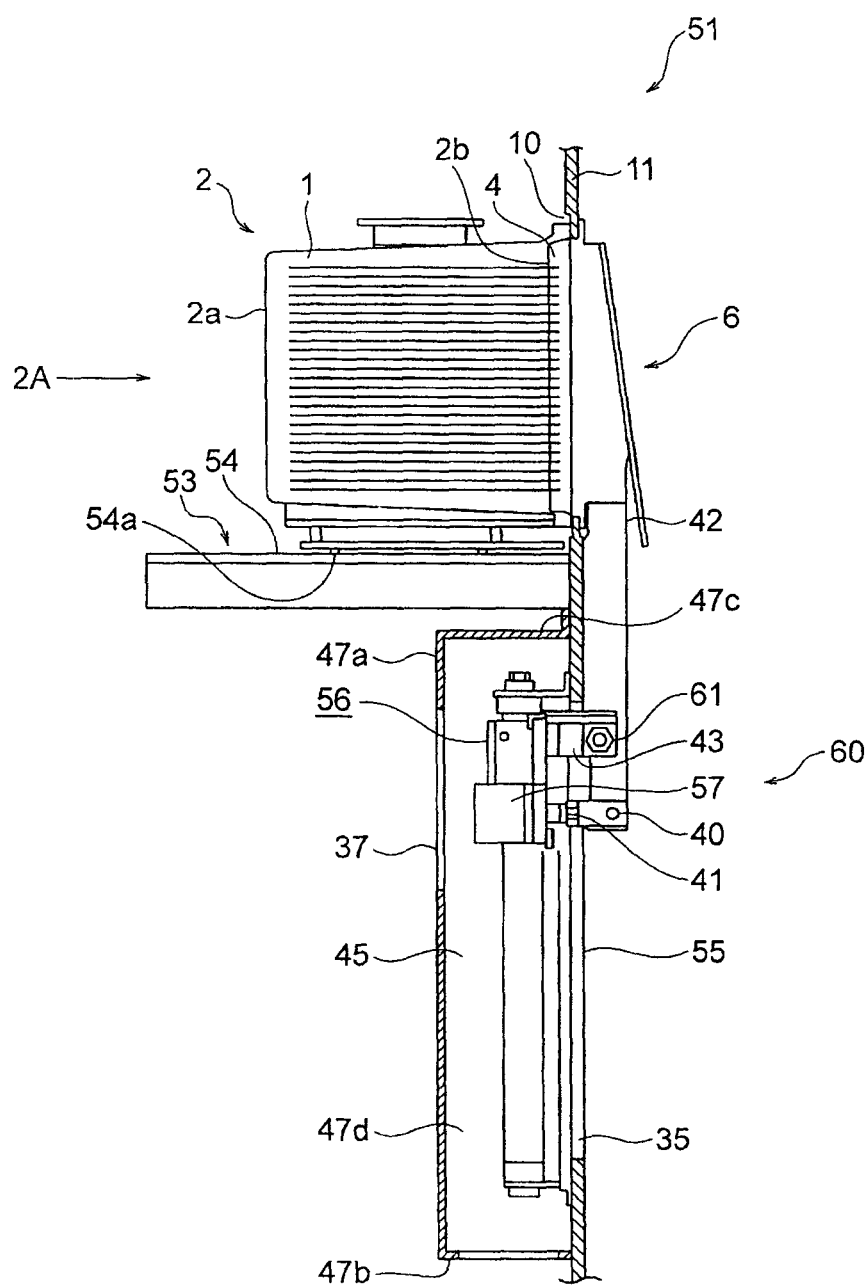
FIG. 1 is a side view showing a basic structure of a load port apparatus on which a pod is placed according to an embodiment of the present invention.
Figure 2A:
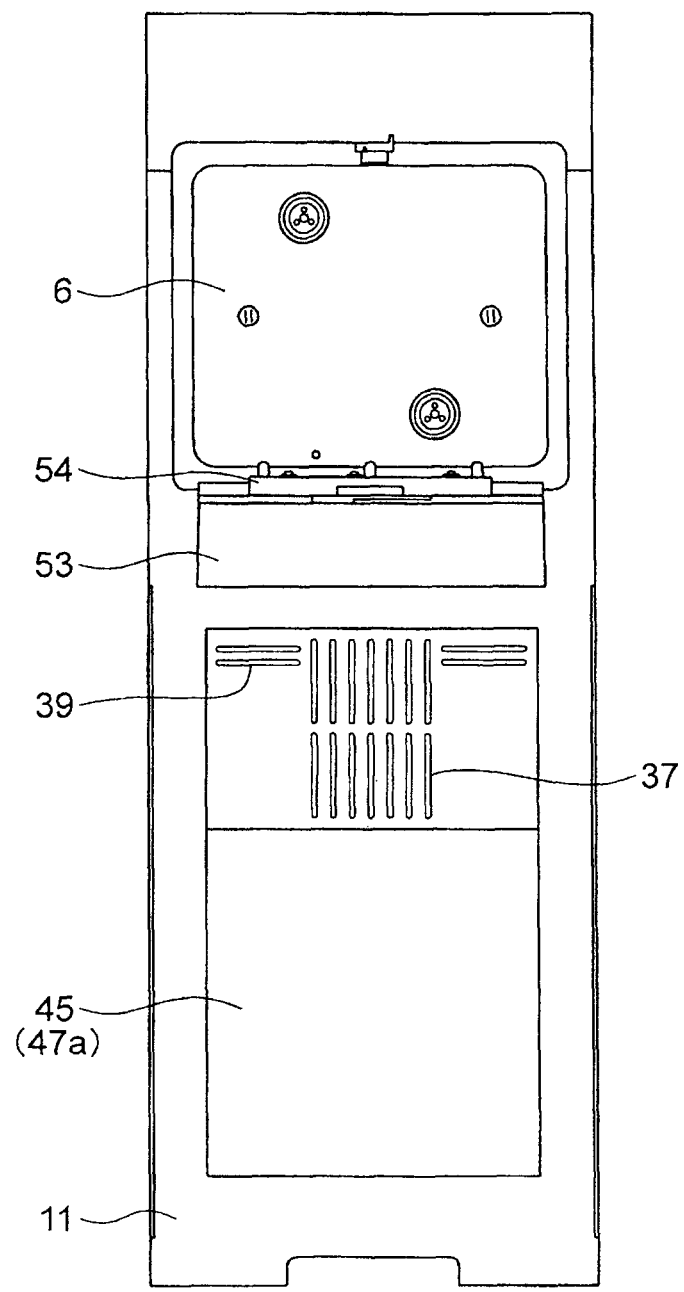
FIG. 2A schematically shows the structure of the load port apparatus without the pod as seen in the direction of arrow 2A in FIG. 1.
Figure 2C:
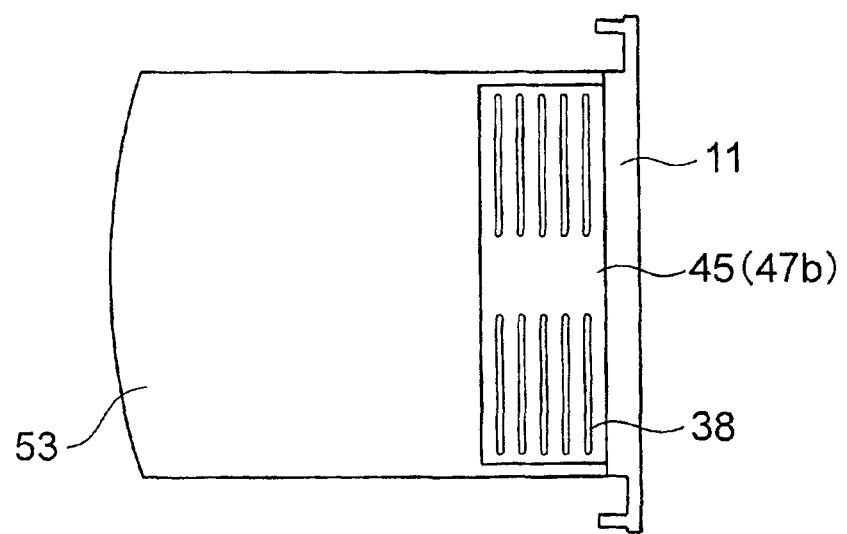
FIG. 2C shows the load port apparatus shown in FIG. 2B as seen in the direction of arrow 2C.
Figure 3:
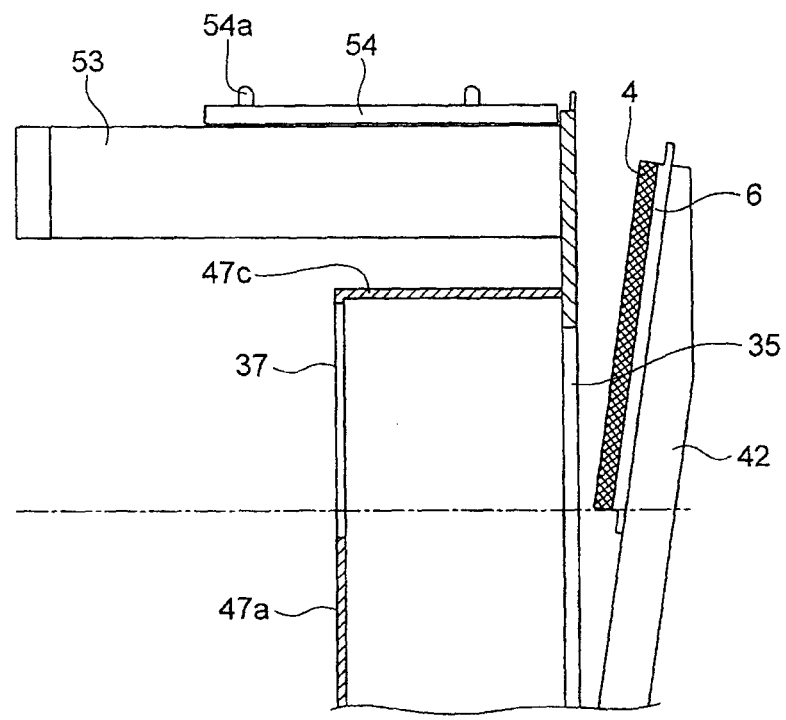
FIG. 3 schematically shows the positional relationship among a communication opening portion, a first exhaust opening portion and a second exhaust opening portion in the load port apparatus according to the embodiment in the state in which the door is located at the lowest position.
Figure 4:
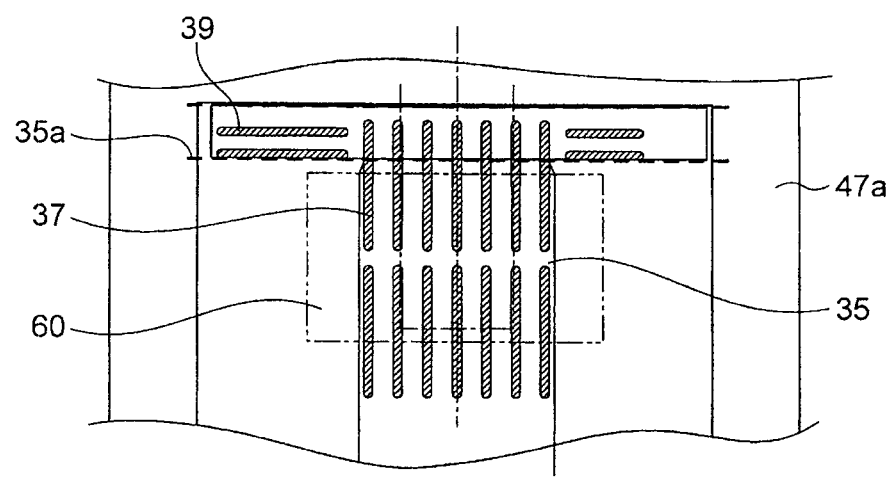
FIG. 4 schematically shows the positional relationship among the communication opening portion, the first exhaust opening portion and a third exhaust opening portion in the load port apparatus according to the embodiment.

In the following, an embodiment of the present invention will be described with reference to the drawings. FIG. 1 schematically shows the structure of the relevant portion of a load port apparatus according to a first embodiment of the present invention. More specifically, FIG. 1 is a partially opened-up view showing the aforementioned support table, door, opening portion, door driving mechanism, wall having the opening portion that partially defines the mini-environment, the housing chamber in which the door driving mechanism is housed, and auxiliary equipment as seen from the side. FIG. 2A schematically shows the structure of the load port apparatus without the pod as seen in the direction of arrow 2A in FIG. 1. FIG. 2B shows the load port apparatus without the pod as seen from the side as with FIG. 1. FIG. 2C schematically shows the structure of the load port apparatus as seen in direction of arrow 2C in FIG. 2B. FIG. 3 shows the load port as seen from the side as with FIG. 1. FIG. 3 shows the positional relationship of the door located at its lowest position and a first exhaust opening that will be described later. FIG. 4 schematically shows the positional relationship of some components around the first exhaust opening as seen in direction of arrow 2A in FIG. 1.

Firstly, the pod to be set on the load port and wafers stored in the pod will be described. The body 2a of the pod 2 has an interior space in which stored objects or wafers 1 are to be stored. The body 2a has a substantially box-like shape having an opening on one lateral side thereof.

The pod 2 also has a lid 4 for tightly closing the opening 2b of the body 2a. A rack (not shown) having a plurality of tiers for holding the wafers 1 horizontally one above the other along the vertical direction is provided in the body 2a. In the interior of the body 2a, the wafers 1 placed on the rack are arranged at regular intervals therebetween. The wafer 1 corresponds to the stored object defined according to the present invention, the pod 2 corresponds to the storage container or the pod defined according to the present invention, the body 2a having a basically box-like shape corresponds to the body defined to have a substantially box-like shape according to the present invention, and the opening 2b of the pod 2 having basically rectangular shape corresponds to the opening defined to have a substantially rectangular shape according to the present invention.

The load port apparatus 51 according to the present invention includes a support table 53, a door 6, an opening portion 10 serving as the opening portion of the load port, a door driving mechanism 60, and a wall 11 provided with the opening portion 10. The wall 11 is a member that defines the mini-environment (i.e. transfer chamber 52 that will be described later in connection with FIG. 8). According the present invention, in relation to the wall 11, the door 6 and the mini-environment are defined to be components located on a first side of the wall 11. The mini-environment is defined as an arrangement that includes the door 6 etc. The support table 53, the main driving system in the door driving mechanism 60 and a housing chamber 45 that will be described later are defined to be components located on a second side of the wall 11.

The support table 53 includes a movable plate 54 having a flat surface on the top on which the pod 2 is actually placed and can move the pod placed thereon toward and away from the opening portion 10. Positioning pins 54a are mounted on the flat surface of the movable plate 54. The positioning pins 54a are fitted into positioning recesses (not shown) provided on the bottom surface of the pod body 2a, whereby the positional relationship between the pod 2 and the movable plate 54 is uniquely determined.

The size of the opening portion 10 provided in the wall 11 is such that it fitly receives the lid 4 that closes the pod opening 2a when the pod 2 positioned on the movable plate 54 is brought closest to the opening portion 10 by the plate 54. Specifically, the opening portion 10 has a rectangular shape that is a little larger than the rectangular contour of the lid 4. The pod 2 may be positioned and kept stationary by the movable plate 54 at any position that allows the door 6 to detach the lid 4 of the pod 2 from the pod body 2a.

The mini-environment is located on the first side of the wall 11, and the external space is located on the second side of the wall 11. Thus, the wall 11 is adapted to separate these spaces. The opening portion 10 allows the communication between the mini-environment and the external space. The door 6 is supported by the door opening/closing mechanism 60 via a door arm 42. The door 6 can hold the lid 4 using a lid holding mechanism that is not shown in the drawing.

The door driving mechanism 60 can move the door 6 between a position at the it substantially closes the opening portion 10 and a opening position or retracted position at which it fully opens the opening portion 10 to allow the robot (see FIG. 8) that is not shown in FIGS. 1 to 4 to transport wafers 1 into/out of the pod 2 through the opening portion 10. The door 6 is joined to one end of the door arm 42 by means of a securing member that is not shown in the drawings. The other end of the door arm 42 is supported on the end of a rod 41, which is a part of an air-driven hydraulic cylinder 57, by means of a pivot shaft 40 so that the door arm 42 can swing about the pivot shaft 40 and the door 6 is capable of pivoting with respect to the pivot shaft 40.

The door arm 42 has a through hole at a position between both ends. A pin (not shown) is inserted through the through hole on the door arm 42 and a hole provided on a securing member 43 that is supported and secured by a movable portion 56 that moves up and down the components, such as door arm 42, for opening and closing the door 6. This arrangement of the pin constitutes a fulcrum 61. Thus, the door arm 42 can swing about the fulcrum 61 as the rod 41 extends/retracts with the driving of the cylinder 57. These components constitute the door driving mechanism 60.

The door driving mechanism 60 causes the door 6 that closes the opening portion 10 to swing about the fulcrum 61 thereby separating it apart from opening portion 10 and then moves it down to the lower retracted position (opening position) at which the door does not interfere with the transfer of wafers. Specifically, the door driving mechanism 60 causes the door 6 that holds the lid 4 to swing by a certain angle in the range of, for example, 5 to 10 degrees, thereby detaching the lid 4 from the pod body 2a. The cylinder 57 and other components function as a swing mechanism that causes the door to swing over a certain angle range.

Thereafter, the door 6 moves down with the downward movement of the movable member 56 and stops at the predetermined lower lid opening position or the retracted position at which it does not interfere with the transfer of wafers. This stopping position is defined in the present invention as the door opening position, for the sake of explanation. The components, such as the cylinder rod 41, the securing member 43, that are included in the door driving mechanism 60, support the door 6 indirectly via the door arm 42, and pass through a communication opening portion 35 that will be described later are defined in the present invention as the door supporting portion, for the sake of explanation, and regarded as a portion separated from the main part of the door driving mechanism 60.

The movable portion 56 moves vertically. The door 6 moves up and down with the upward and downward movement of the movable portion 56. The movable members, such as the movable portion 56, the body of the cylinder 57, that can generate dust are disposed outside the mini-environment to the extent possible. Specifically, the wall 11 is provided with a communication opening portion 35 having a width that allows minimum necessary members that extend in the operation direction of the movable portion 56 and support the door arm 42 can pass. As such, the communication opening portion 35 has the function of allowing communication between the space in the housing chamber 45 and the mini-environment. The cylinder rod 41 and other members extend through the communication opening portion 35 and joined to the door arm 42.

The movable portion 56 and the other members disposed outside the mini-environment are located in the housing chamber 45 that is provided independently from the mini-environment. In this way, the main driving section among the components of the door driving mechanism 60 that opens/closes the door 6 and moves it upward/downward is disposed in the housing chamber 45, and the housing chamber 45 is in communication with the mini-environment through the communication opening portion 35 provided in the wall 11. Specifically, the housing chamber 45 is located on the same side of the support table 53 on which the pod 2 is placed with respect to the wall 11 and vertically below the support table 53.

As shown in FIGS. 1 and 2A, the housing chamber 45 is defined by a front wall 47a that is opposed to the wall 11, a bottom wall 47b that closes the bottom (or the lower portion along the up and down axis of the door 6), a top wall 47c that closes the top, and a pair of side walls 47d. That is, the housing chamber 45 is defined as a chamber by plate members of plate shapes, including the front wall 47a, the bottom wall 47b, the top wall 47c, and a pair of side walls 47d. The front wall 47a is provided with a first exhaust opening portion 37 passing through the front wall 47. The gas in the housing chamber 45 can flow through the first exhaust opening portion 37 to the external space. The first exhaust opening portion 37 is provided in the upper portion of the front wall 47a at a position partially opposed to the communication opening portion 35. In other words, the first exhaust opening portion 37 is arranged in such a way that at least part of it faces the communication opening portion 35.

In this embodiment, the first exhaust opening portion 37 is composed of a plurality of slits that extend along the vertical direction and are arranged side by side in parallel to the wall 11. The slits are arranged in the area corresponding to the width of the communication opening portion 35 as shown in FIG. 4. The upper end of the area in which the slits are provided corresponds to the upper end of the workable area of the front wall 47a, and the lower end is located below the bottom of the door 6 that is located at its lowest position in the downward movement.

In other words, when the level of the bottom of the door 6 at its lowest position and the level of the lower end of the slits in the first exhaust opening portion 37 are compared in the horizontal plane, the lower end of the slits are located below the bottom of the door 6. FIG. 4 shows the area occupied by the door driving mechanism 60 in the housing chamber 45 by chain double-dashed lines to facilitate understanding.

Down flow is created in the mini-environment by the fan provided in the upper portion of the mini-environment. This keeps the pressure in the mini-environment higher than the external space. By virtue of the first exhaust opening portion 37 provided at the above-described position, the gas flowing from the mini-environment into the housing chamber 45 through the communication opening portion 35 due to the difference between the pressure in the mini-environment (which is higher) and the pressure in the housing chamber (which is lower) flows out to the external space without creating a significant turbulent flow. Specifically, by arranging the communication opening portion 35 and the first exhaust opening portion 37 in such a way as to face at least partially each other, the facing part provides a major gas flow passage, which allows smooth gas flow.

With the arrangement of the lower end of the slits in the first exhaust opening portion 48 below the bottom of the door 6 at the lowest position, a part of the down flow diverted to the interior or the housing chamber by the door 6 can be partly allowed to flow out through the slits. Such gas flows resulting from the down flow has high speed, and it is expected to involve the gas around it as it goes out to the external space through the slits. This enables effective removal and replacement of the gas in the interior of the housing chamber 45.

Furthermore, when for example wafers 1 are transferred into/out of the pod 2, the door 6 is located at a retracted position with a certain angle of elevation relative to the down flow in accordance with the swing angle. Therefore, the door 6, as well as the pressure difference, provides, the effect of diverting the down flow in the mini-environment toward the interior of the housing chamber 45. This provides the effect of expelling dust particle or the like in the housing chamber 45 more positively to the external space. Therefore, it is preferred that the range of movement or the stop position of the door be designed in such a way that when the door 6 is kept stationary at the opening position, at least a portion of the door 6 faces the communication opening portion 35.

In this embodiment, a second exhaust opening portion 38 is provided in the bottom wall 47b, as shown in FIG. 2C. The second exhaust opening portion 38 includes a plurality of slits that are arranged side by side in a horizontal plane and each extend perpendicularly to the vertical direction and parallel to the wall 11. The second exhaust opening portion 38 is provided in the entire workable area of the bottom wall 47b.

In the present invention, it is most necessary to prevent floating dust particles from entering the mini-environment and reaching the region through which wafers are transported. Therefore, it is preferred that the main stream of the gas in the housing chamber 45 also flows in the direction from top to the bottom. To achieve this, it is preferred that the total sum of the areas of the opening areas of the slits (in the first exhaust opening portion 37, in this embodiment) provided in the front wall 47a be substantially equal to or smaller than the total sum of the areas of the opening areas of the slits (in the second exhaust opening portion 38) provided in the bottom wall 47b. Then, the main stream of the gas in the housing chamber 45 can be directed from top to bottom.

In addition, not providing the first exhaust opening portion in the lower area of the front wall 47a can contribute to more positive creation of gas flow directed from top to bottom in the space in the housing chamber 45. The bottom wall 47b in which the second exhaust opening portion 38 is provided is defined, according to the present invention, as the wall to which the door driving mechanism 60 comes closest among the walls of the housing chamber 45 at the time when the door 6 is located at the opening position at which it leaves the opening portion 10 open.

In this embodiment, back-flow of gas from the external space into the housing chamber 45 and back-flow of gas from the housing chamber 45 into the mini-environment should not be allowed, because they will cause detrimental diffusion of dust particles. Therefore it is necessary that the following relationship among the pressures in the respective spaces holds at all times: the pressure in the mini-environment is higher than the pressure in the housing chamber, and the pressure in the housing chamber is higher than the external space. In view of the above, it is preferred that the total sum of the areas of the openings of the slits that allow communication between the housing chamber 45 and the external space be substantially equal to or smaller than the area of the opening of the communication opening portion 35 at all times.

As described before, according to the present invention, not providing the first exhaust opening portion in the lower area of the front wall 47a facilitates the establishment of the above described relationship of pressure difference, and in addition, the main stream of gas is directed toward the second exhaust opening portion in the lower region in the housing chamber. As the above relationship holds, gas flow from the communication opening portion 35 to the external space through the slits is created in substantially the entire region of the housing chamber from its top to bottom. Therefore, dust particles generated from components of the door driving mechanism 60 in the housing chamber 45 and from components that extend into the mini-environment through the communication opening portion 35 will be effectively discharged to the external space.

In this embodiment, third exhaust opening portions 39 are arranged on both sides of and adjacent to the upper portion of the first exhaust opening portion 37 in the front wall 47a. The third exhaust opening portions 39 each include a plurality of slits that extend along the horizontal direction parallel to the wall 11 and arranged side by side along the vertical direction.

As shown in FIG. 4, the third exhaust opening portions 39 are provided in the front wall 47 at positions above the upper end (illustrated by broken line 35) of the communication opening portion 35. In other words, the third exhaust opening portions 39 are located above the communication opening portion 35 when both are projected on the same vertical plane. After flowing through the communication opening portion 35 into the housing chamber 45, gas spreads in four directions (i.e. in vertical and horizontal directions) perpendicular to the direction of flow through the communication opening portion 35. Thus, the stream of gas is broadened. The broadened portion of this gas stream strikes a region of the front wall 47a in which the first exhaust opening portion 37 is not provided to create a vortex in the housing chamber 45. Since there is a gas stream flowing generally in the direction from top to bottom in the housing chamber 45, the vortex moves downward and eventually goes out to the external space through the second exhaust opening portion 38.

However, the gas in the space above the communication opening portion 35 may be prevented by the gas flowing through the communication opening portion 35 from swiftly moving downward and stay or stagnate in that space. Such a space in the housing chamber 45 is referred to, in the present invention, as a "gas stagnation region".

By providing the third exhaust opening portions 39 at positions corresponding to the gas stagnation regions, namely above the communication opening portion 35, the stagnating gas can be swiftly discharged to the external space through the third exhaust opening portions 39.

In the dust exhaust method for load port apparatus according to an embodiment of the present invention, the load port according to the above-described embodiment is used, and dust particles are effectively removed by performing the following steps.

In the first step concerning to gas flow, clean gas is introduced into the mini-environment by the fan filter unit provided in the upper portion of the mini-environment. Thus, down flow or a stream of gas flowing in the direction from top to bottom is created in the mini-environment. In addition, with the introduction of gas, the pressure in the mini-environment is kept at a predetermined high pressure.

Then in the second step, the clean air flows from the mini-environment into the housing chamber 45 that is in communication with the mini-environment through the communication opening portion 35. This inflow of gas is result from the down flow with the aid of a first pressure difference between the interior of the mini-environment and the interior of the housing chamber 45 provided by the communication opening portion 35 (and the relationship between it and the exhaust opening portions provided for the housing chamber 45). The inflow of clean gas resulting from the down flow makes the pressure in the interior of the housing chamber 45 higher than the pressure in the external space by a second pressure difference.

In the third step, flow of gas from the housing chamber 45 to the external space through the exhaust opening portions are created utilizing this pressure difference. This flow of gas removes dust particles generated in the housing chamber 45 or brought into the housing chamber 45 from the mini-environment out to the external space. With this exhaust or removal method, minute dust particles or the like can be effectively removed from the interior space of the load port apparatus.

Figure 5A:
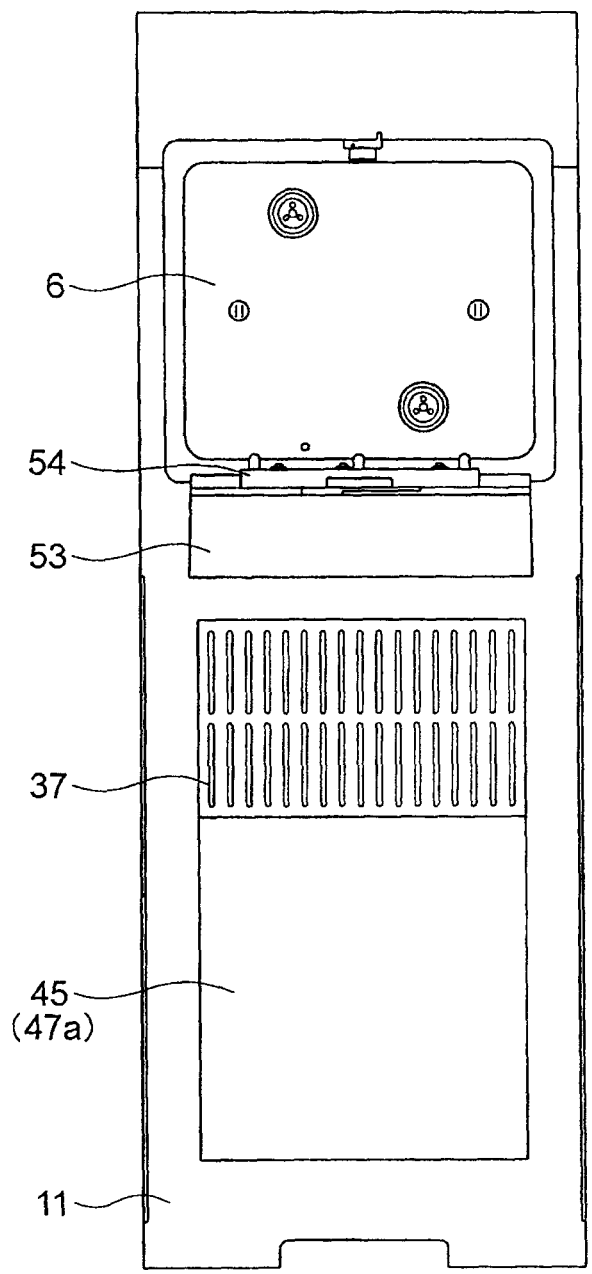
FIG. 5A is a front view showing a load port apparatus according to a second embodiment of the present invention in the same manner as FIG. 2A.
Figure 5B:
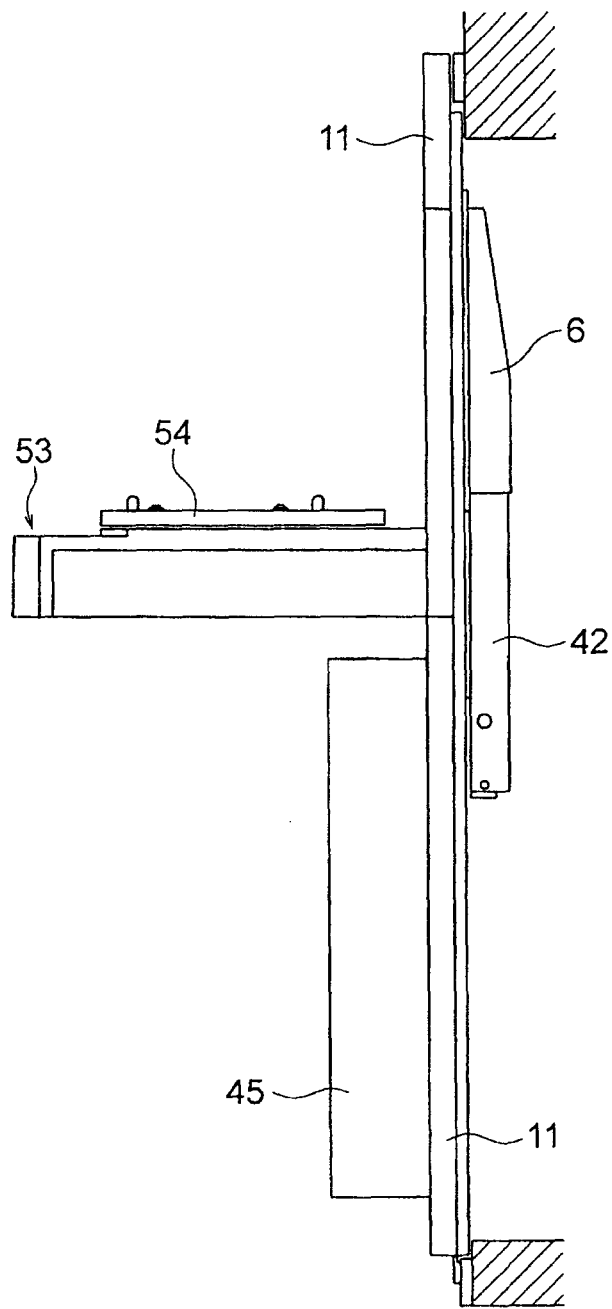
FIG. 5B is a side view showing the load port apparatus according to the second embodiment of the present invention in the same manner as FIG. 2B.
Figure 5C:
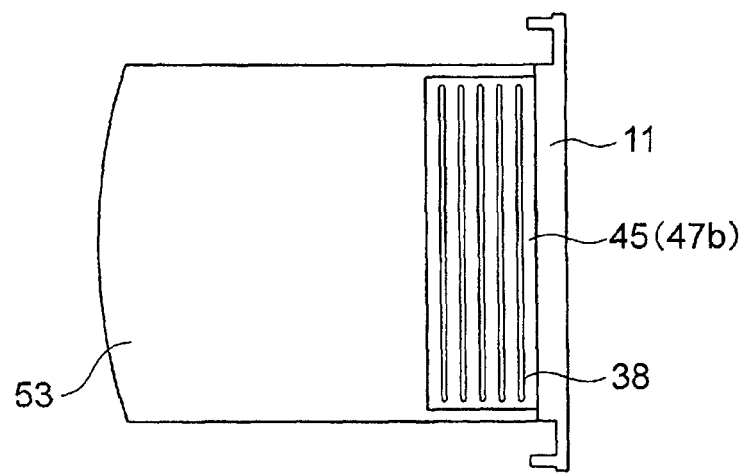
FIG. 5C is a bottom view showing the load port apparatus according to the second embodiment of the present invention in the same manner as FIG. 2C.

Next, a second embodiment of the present invention will be described. FIGS. 5A to 5C show the general structure of the load port apparatus according to the second embodiment in the same manner as FIGS. 2A to 2C. In the following, only the portions that are different from the first embodiment will be described, and the like components will be denoted by like reference signs and not be described in detail.

In this embodiment also, there is provided a first exhaust opening portion 37 including slits that extend along the vertical direction as with the first embodiment. In the second embodiment, the width of the area over which the slits are provided extends over the entire width of the workable region of the front wall 47a. The third exhaust opening portion 39 has been eliminated accordingly. In addition, the width of the area over which the slits constituting the second opening portion 38 provided in the bottom wall 47b is made wider than that in the first embodiment.

Although the above arrangement makes it more difficult to provide an adequate pressure difference among the mini-environment, the housing chamber 45, and the external space, the above arrangement provides an advantage in preventing or reducing stagnation of gas in the upper region in the housing chamber 45 and in creating gas flow in the direction from top to bottom more reliably.

Figure 6A:
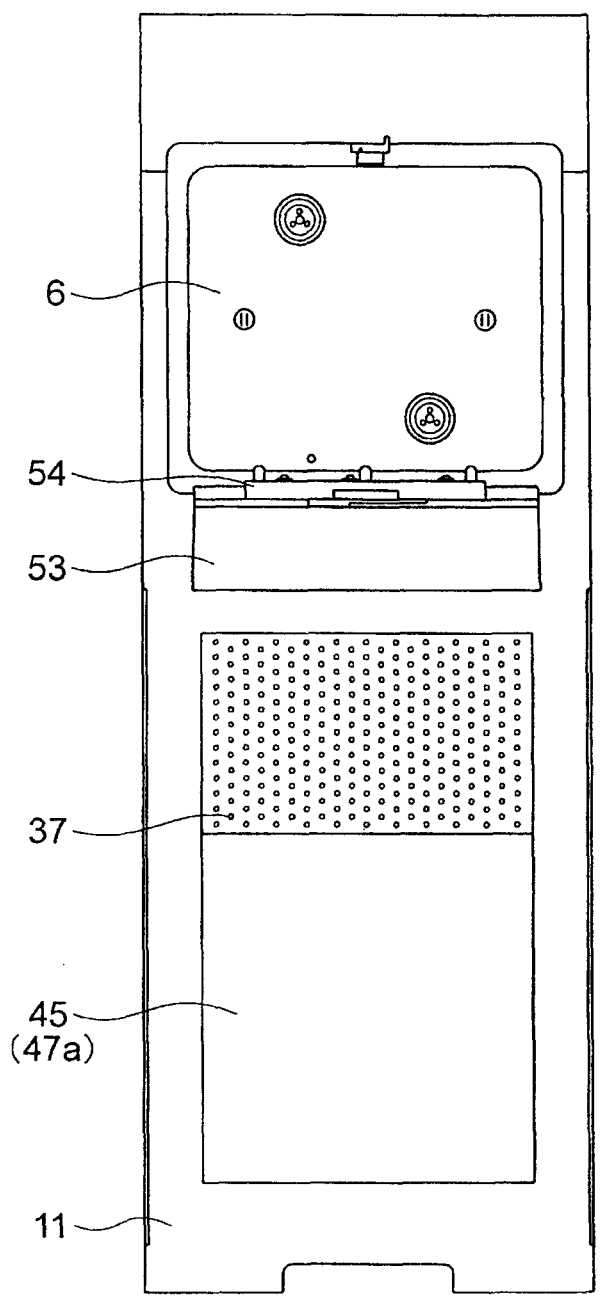
FIG. 6A is a front view showing a load port apparatus according to a third embodiment of the present invention in the same manner as FIG. 2A.
Figure 6B:
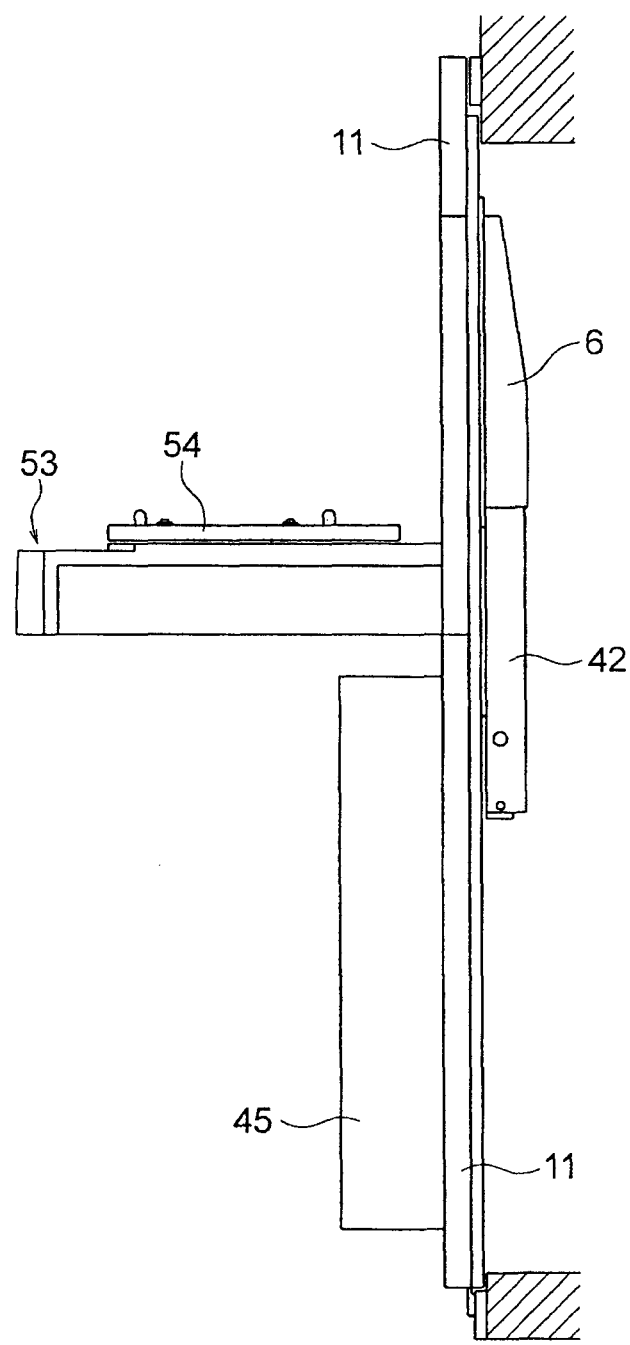
FIG. 6B is a side view showing the load port apparatus according to the third embodiment of the present invention in the same manner as FIG. 2B.
Figure 6C:
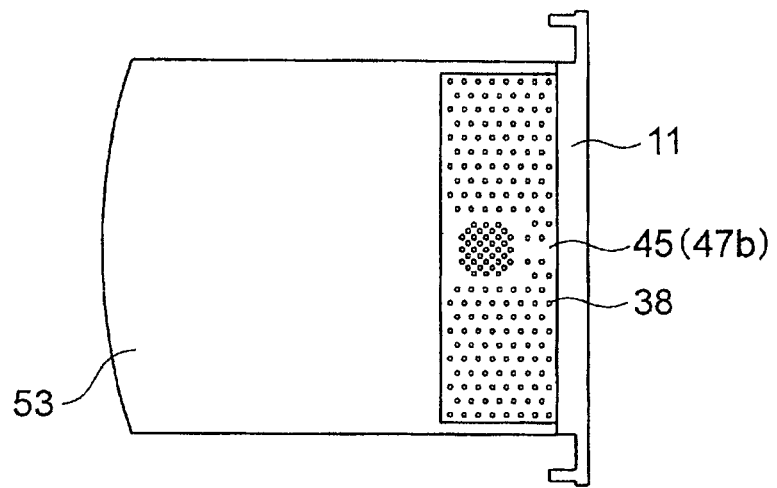
FIG. 6C is a bottom view showing the load port apparatus according to the third embodiment of the present invention in the same manner as FIG. 2C.

Next, a third embodiment of the present invention will be described. FIGS. 6A to 6C show the general structure of the load port apparatus according to the third embodiment in the same manner as FIGS. 2A to 2C. In the following, only the portions that are different from the first embodiment will be described, and the like components will be denoted by like reference signs and not be described in detail.

In this embodiment, the areas over which the first exhaust opening portion 37 and the second exhaust opening portion 38 are provided are the same as those in the second embodiment. However, in this embodiment, the exhaust opening portions includes holes instead of slits. Specifically, the walls having the first and second exhaust opening portions are made of perforated metal plates. If the exhaust opening portion includes slits, laminar flows are formed as the gas passes through the slits. This is expected to provide the effect of causing the gas to flow out to the external space at higher speed.

In the case of this embodiment, although such an effect cannot be expected, the holes that serve as exhaust openings can be provided over a larger area. This provides the effect of causing the gas to flow out over a large area.

Figure 7A:
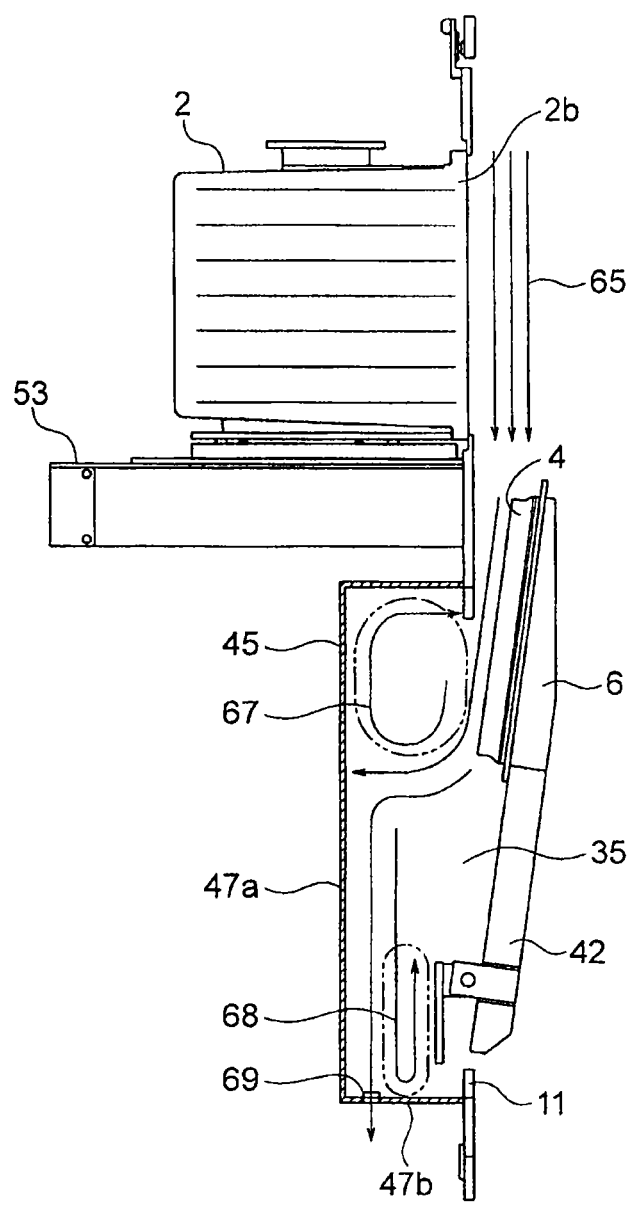
FIG. 7A schematically shows gas flows in the housing chamber in a conventional load port apparatus.
Figure 7B:
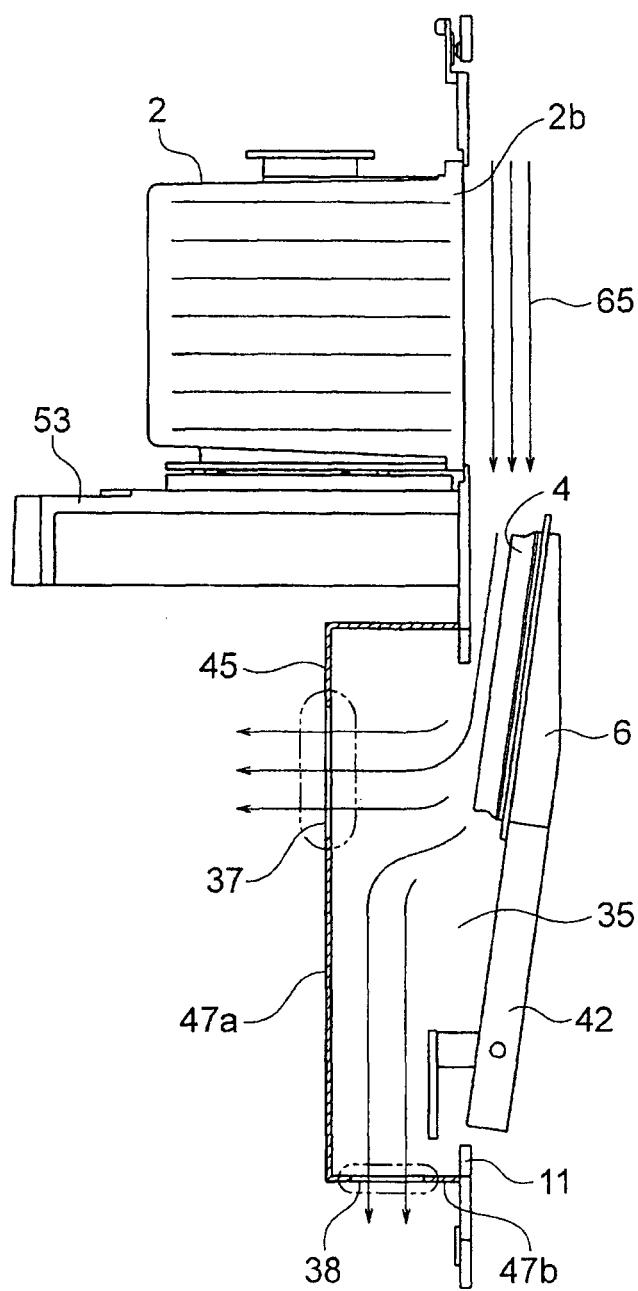
FIG. 7B schematically shows gas flows in the housing chamber in a load port apparatus according to an embodiment of the present invention.

In the following, the operation of the present invention will be described with reference to FIGS. 7A and 7B. FIGS. 7A and 7B schematically shows streams of gas from the load port apparatus and the mini-environment to the external space in the same format as FIG. 2A. FIG. 7A shows a conventional structure, and FIG. 7B shows the structure of the apparatus according to the present invention.

In the mini-environment, down flow 65 is created by the fan disposed in the upper portion of the mini-environment. While a portion of the down flow gas stream goes out through the down flow exhaust passage (not shown) provided in the lower portion of the mini-environment, another portion flows into the housing chamber 45 through the communication opening portion 35 due to a pressure difference or diversion by the door 6 or the lid 4 held by the door 6. The load port apparatus having the conventional structure has only an exhaust fan provided in the lower portion of the housing chamber 45, but it does not have the first exhaust opening portion 37 and the second exhaust opening portion 38 shown in FIG. 7B Therefore, the gas stream flowing into the housing chamber 45 through the communication opening portion 35 forms a first vortex 67 in the upper space in the housing chamber 45. Furthermore, the course of the gas stream is blocked by the first vortex 67 and directed downward. This downward stream is blocked by a portion of the bottom wall other than the fan 69 to form a second vortex 68. The fan 69 can exhaust only a portion of the gas, and dust particles are stirred up in the housing chamber 45 by the first vortex 67 and the second vortex 68 existing in the chamber. Therefore, there is a possibility that dust particles enter the mini-environment.

As shown in FIG. 7B, in the apparatus according to the present invention, the first exhaust opening portion 37 and the second exhaust opening portion 38 are provided in the areas of the front wall 47a and the bottom wall 47b near the regions in which a vortex can be created. This can decrease the probability of creation of the first vortex 67 and the second vortex 68, create stable streams of gas flowing from the interior of the housing chamber 45 to the external space, and discharge dust particles in the housing chamber 45 quickly.

In the above described embodiment, the area of, for example, the bottom wall 47b over which the second exhaust opening portion 38 is provided is defined to be the entire workable area or the entire area. In order simply for the gas stream in the lower portion or space in the housing chamber 45 to flow mainly downward, it is preferred that the bottom wall 47b is eliminated to leave the bottom open. However, actually, it is necessary to maintain predetermined pressure differences between the mini-environment, the housing chamber 45, and the external space, as described before. Furthermore, it is difficult to increase the pressure in the mini-environment by simply enhance the blowing power of the upper fan.

Therefore, it is necessary for the second exhaust opening 38 to have a certain degree of exhaust resistance. It is necessary that the exhaust resistance, or the total sum of the opening areas in the second exhaust opening portion 38 and the size and shape of each of the openings that constitute the opening portion be changed appropriately in accordance with factors such as the size of the mini-environment, the capacity of the upper fan, and the quantity of purge nitrogen gas supplied into the mini-environment. Therefore, the entire area defined in the context of this specification should be interpreted as an area with which the second exhaust opening portion 38 allows the stream of gas flows mainly downward in the entire lower region in the housing space in the housing chamber 45.

This interpretation also applies to the area over which the third exhaust opening portion 39 is provided in the front wall 47a. The area over which the third exhaust opening portion 39 is provided should be interpreted as an area corresponding to the region in which the stagnation region that can be formed in the upper region or space in the housing chamber 45 in which the gas may stagnate.

Although in the above-described embodiments, the exhaust opening portions are constituted by a plurality of slits or holes, the present invention is not limited to them. Specifically, each exhaust opening portion may be constituted by a mesh or the like, or a combination of slits, holes and a mesh or the like. In cases where the exhaust opening portion includes slits or holes, the density thereof may be different at different positions, and the size of the slits or holes may be varied. What is essential is that the respective total sums of the opening areas in the first to third communication opening portions 37, 38, 39 are designed in such a way that the relationship "(pressure in the mini-environment)>(pressure in the housing chamber)>(pressure in the external space)" holds at any time so that irreversible flows from the mini-environment to the housing chamber and then to the external space through the communication opening portion 35, the first exhaust opening portion 37, the second exhaust opening portion 38, and the third exhaust opening portion 39 are created.

Through holes or the like that bring the housing chamber 45 into communication with the external space may be provided not only on the front wall 47a and the bottom wall 47b but also on the top wall 47c and the side walls 47d to provide exhaust opening portions on the entire area or certain positions in the walls that define the housing chamber 45. In this case also, the arrangement of the through holes is not limited to that in the above-described embodiments, so long as the density, size, and shape of the through holes are varied so that the above-mentioned pressure difference, partial and direct discharge of the gas introduced to the housing chamber 45 through the communication opening portion 35 through the upper portion of the front wall 47a, creation of gas stream mainly flowing from top to bottom in the housing chamber 45, and the aforementioned relationship among total sum areas of the opening portions are achieved.

Figure 8:
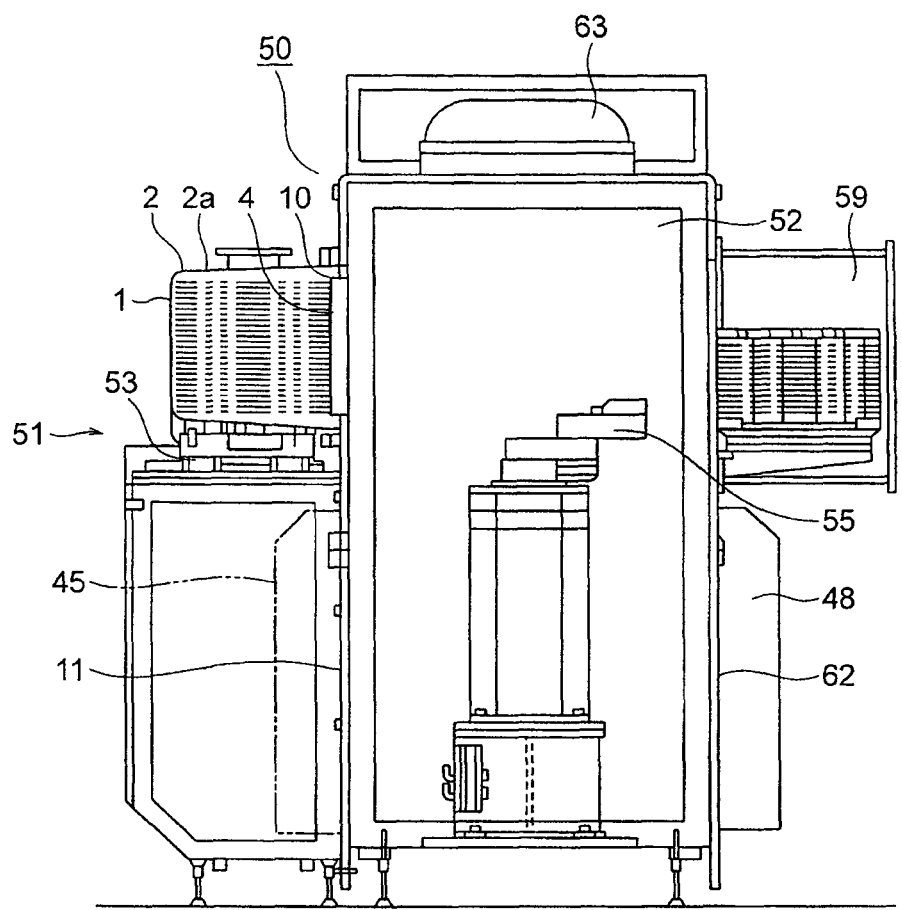
FIG. 8 schematically shows a semiconductor processing apparatus that uses a load port apparatus according an embodiment of the present invention.

In the following, a basic structure of a semiconductor processing apparatus in which the load port apparatus according to the embodiment is used will be described. FIG. 8 shows a basic structure of a semiconductor wafer processing apparatus 50 compatible with what is called a mini-environment system. The semiconductor wafer processing apparatus 50 is mainly composed of a load port apparatus (FIMS system or lid opening/closing apparatus) 51, a transfer chamber (mini-environment) 52, and a processing chamber 59. These portions are bordered by the load port side wall 11 and the processing chamber side wall 62.

In the transfer chamber 52 of the semiconductor wafer processing apparatus 50, an air stream (or down flow) flowing from top to bottom of the transfer chamber is created by a fan filter unit 63 provided in the upper portion so as to discharge dust and keep a high degree of cleanliness. The fan filter unit 63 includes a fan and a filter to introduce the outside air into the transfer chamber 52 after removing dust or the like. The bottom wall of the transfer chamber 52 is provided with down flow exit passage (not shown). A second opening portion (not shown) and a second door (not shown) that closes the second opening portion like the door 6 provided between the mini-environment 52 and the load port apparatus are provided between the mini-environment 52 and the processing chamber 59.

The load port apparatus 51 is provided with the above-described housing chamber 45, and the processing chamber 48 is also provided with a second housing chamber 48 for the second door (not shown). With the above-described structure, dust particles generated from the apparatus for driving the door etc. will be continuously discharged to the external space by air streams flowing from the mini-environment 52 to the housing chamber and then to the external space. A pod 2 or a storage container for silicon wafers or the like (which will be simply referred to as "wafers" hereinafter) is placed on a support table 53 of the load port apparatus 51.

As described before, a high degree of cleanliness is maintained in the interior of the transfer chamber 52 to allow handling of wafers 1. A robot 55 that can actually hold a wafer in the transfer system is provided in the transfer chamber 52. Wafers are transferred between the pod 2 and the processing chamber 59 by the robot 55. Various apparatuses for performing processing such as film formation and film processing on the wafer surface are typically provided in the processing apparatus 59. Since these apparatuses are not directly relevant to the present invention, they will not be described further.

By using the load port apparatus having the above-described structure, dust or the like generated in the interior of the housing chamber that defines the housing space can be discharged to the external space quickly and effectively. Furthermore, so minute dust particles generated in the interior of the housing chamber as little affected by gravity are effectively prevented from moving into the mini-environment. Therefore, the present invention can provide a sufficiently clean environment suitable for a manufacturing process of semiconductor devices having an increased packing density.

While the present invention has been described reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-216436, filed on Sep. 18, 2009, which is hereby incorporated by reference herein its entirety.

What is claimed is:
1. A load port apparatus that attaches/detaches a lid of a pod composed of said lid and a body portion that has an opening to be closed by said lid on one side and stores a content object in the interior, thereby opening/closing said opening to allow transfer of said content object into and out of said body portion, comprising:
 a wall that defines a mini-environment on a first side thereof and an external space on a second side thereof and has an opening portion that allows communication between said mini-environment and said external space;
 a door that is disposed on said first side of said wall, closes said opening portion, and can hold said lid;
 a support table that supports said pod at such a position that allows said opening to be opposed to said opening portion on said second side of the wall;
 a door driving mechanism that supports said door on said first side by a door supporting portion that operates on said second side to support said door and moves said door between a closing position at which the door closes said opening portion and an opening position at which the door leaves said opening portion;

a housing chamber disposed on said second side and houses said door driving mechanism, and defined as a chamber by plate members including a front wall and a bottom wall; and a communication opening portion provided in said wall through which said door supporting portion can pass and that allows communication between said housing chamber and said mini-environment, wherein said housing chamber has a first exhaust opening portion and a second exhaust opening portion, said first exhaust opening portion being provided in said front wall of said plate members of said housing chamber, opposed to said communication opening portion, so as to allow communication between said housing chamber and said external space, said second exhaust opening portion being provided in said bottom wall of said plate member of said housing chamber, and located at a position to which said door driving mechanism comes closest in the state in which said door leaves said opening portion open, so as to allow communication between said housing chamber and said external space, and wherein a pressure difference is produced between spaces in said mini-environment and in said housing chamber, and there is produced a pressure difference between the space in said housing chamber and said external space, in such a way that pressure in said mini-environment, said housing chamber, and said external space decreases in order of the mini-environment that contains said door on said first side, said housing chamber, and said external space, and streams of gas from said housing chamber to said external space through said first exhaust opening portion and said second exhaust opening portion are created by said pressure differences.

2. A load port apparatus according to claim 1, wherein at least a portion of said first exhaust opening portion faces said communication opening portion.

3. A load port apparatus according to claim 1 further comprising a third opening portion that is provided at such a position in said front wall that allows gas existing in a gas stagnation region in an upper portion in said housing chamber to flow out.

4. A load port apparatus according to claim 1, wherein said door driving mechanism further comprises a swing mechanism that swings said door in a predetermined angle range, and when said door is in a swung state at said opening position, said door faces said first exhaust opening portion through said communication opening portion.

5. A load port apparatus according to claim 1, wherein said second exhaust opening portion is provided in the entire area in a width direction of said housing chamber so that a gas stagnation region is not formed in a lower portion of said housing chamber.

6. A dust exhaust method for a load port apparatus for discharging dust generated in a load port apparatus, which attaches/detaches a lid of a pod composed of said lid and a body portion that has an opening to be closed by said lid on one side and stores a content object in the interior, thereby opening/closing said opening to allow transfer of said content object into and out of said body portion, to an external space, wherein said load port apparatus comprises:
a wall that defines a mini-environment on a first side thereof and an external space on a second side thereof and has an opening portion that allows communication between said mini-environment and said external space;
a door that is disposed on said first side of said wall, closes said opening portion, and can hold said lid;
a support table that supports said pod at such a position that allows said opening to be opposed to said opening portion on said second side of said wall;
a door driving mechanism that supports said door on said first side by a door supporting portion that operates on said second side to support said door and moves said door between a closing position at which the door closes said opening portion and an opening position at which the door leaves said opening portion open;
a housing chamber disposed on said second side and houses said door driving mechanism, and defined as a chamber by plate members including a front wall and a bottom wall; and
a communication opening portion provided in said wall through which said door supporting portion can pass and that allows communication between said housing chamber and said mini-environment,
said housing chamber having a first exhaust opening portion and a second exhaust opening portion,
said first exhaust opening portion being provided in said front wall of said plate members of said housing chamber, opposed to said communication opening portion so as to allow communication between said housing chamber and said external space,
said second exhaust opening portion being provided in said bottom wall of said plate member of said housing chamber, and located at a position to which said door driving mechanism comes closest in the state in which said door leaves said opening portion open, so as to allow communication between said housing chamber and said external space, the method comprising:
forming a gas flow from an upper portion of the mini-environment to a bottom portion of the mini-environment by introducing gas into the mini-environment that contains said door on said first side;
introducing gas into said housing chamber from said mini-environment, a pressure in said mini-environment, being higher than a pressure in said housing chamber by a first pressure difference due to said gas flow; and
creating streams of gas from said housing chamber, a pressure in said housing chamber, being higher than a pressure in said external space by a second pressure difference due to the introduction of gas, to said external space through said first exhaust opening portion and said second exhaust opening portion, thereby discharging dust generated in said housing chamber to said external space by said streams of gas.

7. A dust exhaust method for a load port apparatus according to claim 6, wherein said door driving mechanism further comprises a swing mechanism that swings said door in a predetermined angle range, and when said door is in a swung state at said opening position, said door diverts the direction of said down flow toward said communication opening portion to assist the introduction of gas into said housing chamber.

* * * * *